United States Patent [19]

Ozawa et al.

[11] Patent Number: 4,903,307

[45] Date of Patent: Feb. 20, 1990

[54] AUDIO APPARATUS HAVING ELECTRONIC GRAPHIC EQUALIZER

[75] Inventors: Hiroshi Ozawa; Shiro Horii; Ichiro Hondo, all of Ibaraki, Japan

[73] Assignees: Hitachi, Ltd., Tokyo; Hitachi Automotive Engineering Company, Ibaraki, both of Japan

[21] Appl. No.: 365,828

[22] Filed: Jun. 14, 1989

[30] Foreign Application Priority Data

Jun. 21, 1988 [JP] Japan .................................. 63-151138

[51] Int. Cl.⁴ .............................................. H03G 5/00
[52] U.S. Cl. ........................................ 381/103; 381/86
[58] Field of Search ............. 333/28 R, 28 T; 381/86, 381/103

[56] References Cited

U.S. PATENT DOCUMENTS

| | | | |
|---|---|---|---|
| 4,458,362 | 7/1984 | Berkovitz et al. | 381/103 |
| 4,559,569 | 12/1985 | Otsuki et al. | 333/28 R |
| 4,661,982 | 4/1987 | Kitazato et al. | 381/103 |

Primary Examiner—Forester W. Isen
Attorney, Agent, or Firm—Antonelli, Terry & Wands

[57] ABSTRACT

An audio apparatus includes an electronic graphic equalizer, in which a plurality of frequency characteristics corresponding to various space configurations are stored preliminarily and a plurality of frequency characteristics corresponding to various types of music are also stored preliminarily. Suitable frequency characteristics are selected from these two groups of frequency characteristics according to a specific spatial configuration and a specific music to be reproduced and combined to obtain a frequency characteristics suitable for the configuration and the music.

6 Claims, 5 Drawing Sheets

AUDIO APPARATUS HAVING ELECTRONIC GRAPHIC EQUALIZER

BACKGROUND OF THE INVENTION

The present invention relates to an audio apparatus having an electronic graphic equalizer and, particularly, to a car audio apparatus of such type capable of easily setting a frequency characteristics thereof suitably to any of various sound sources by compensating for an effect of a sound field.

Heretofore, audio apparata have been sold commercially in which, (1) an original equalizing curve having characteristics compensating for insufficient amplitudes of low and high frequency sounds when a volume is small, (2) an original equalizing curve having characteristics suitable to listen a sound source of mainly voice, such as narration and/or anouncement of news, and (3) an original equalizing curve having characteristics compensating for frequency characteristics of a specific car room, etc., are stored preliminarily and a user selects one them according to demand. The curve itemed in (3) is set by checking frequency characteristics of various room configurations and sound characteristics of sedan type and hatchback type cars so that a flat characteristics can be obtain in most of them.

In general, when same sound source is reproduced in car rooms having different spatial configurations, frequency characteristics of the reproduced sound becomes different. However, since the conventional apparatus has only one averaged original curve for a specific type car, it is difficult to easily obtain an optimum frequency characteristics in each of the respective car rooms having different spatial configurations.

Further, when the kind of sound source such as the kind of music is different, the optimum frequency characteristics becomes different even if the spatial configulation of the room is identical. However, in the conventional apparatus, it is difficult to easily obtain the optimum frequency characteristics for any kind of sound source.

In other words, in the conventional technique, it is difficult to easily obtain an identical frequency characteristics of a specific sound source when reproduced in each of spaces having different sound effects, without very sophisticated manual operation of the equalizer.

SUMMARY OF THE INVENTION

An object of the present invention is to solve the problems of the conventional technique and to provide an audio apparatus having electronic graphic equalizer by which a frequency characteristics of a sound source can be obtained which is suitable for both a spatial configulation of a room in which the sound source is to be reproduced and the kind or genre of sound source.

The above object is achieved by provision of first memory means for storing a first group of frequency characteristics for compensating for a difference in sound effect between different spaces, second memory means for storing a second group of frequency characteristics suitable for the kinds of sound source, means for selecting one of the frequency characteristics stored in the first memory means and one of the frequency characteristics stored in the second memory means and means for combining the selected frequency characteristics.

One of frequency characteristics of the first group which is closest to characteristics suitable to compensate for a sound characteristics of a specific spatial configulation is selected from the first memory means and one of frequency characteristics of the second group which is suitable for the kind of sound source is selected from the second memory means.

Then, these selected frequency characteristics are combined to obtain a composite frequency characteristics and a sound reproduction of a specific sound source such as music is performed on the basis of the composite frequency characteristics.

According to the present invention, in order to obtain a desired frequency characteristics in a space, a user in the space is enough to select the closest frequency characteristics to that for compensating for the sound characteristics of the specific spatial configuration from the first group of frequency characteristics in the first memory means and the suitable frequency characteristics to the kind of sound source from the second memory means. Therefore, the sophisticated operation of the equalizer becomes unnecessary..

DETAILED DESCRIPTION OF THE PREFERRED EMBODIMENTS

Figure 2:
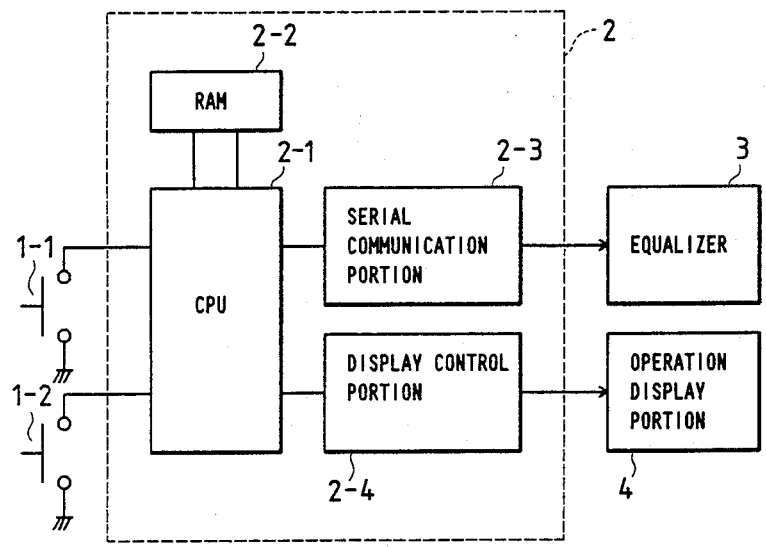
FIG. 2 is a block diagram showing a hard construction of the present invention.

An embodiment of the present invention will be described in detail with reference to the drawings. FIG. 2 is a block diagram of a main portion of the present embodiment. In FIG. 2, the present embodiment includes a car type selection switch (referred to as CAR key hereinafter) 1-1 which is peferably a push button, a music genre selection switch (referred to as "MJNL key", hereinafter) 1-2 which is preferably a push button, an equalizer 3, an operation display portion 4 and a microcomputer 2. The microcomputer 2 includes a CPU 2-1, a RAM 2-2, a serial communication portion 2-3 and a display control portion 2-4.

Figure 1:
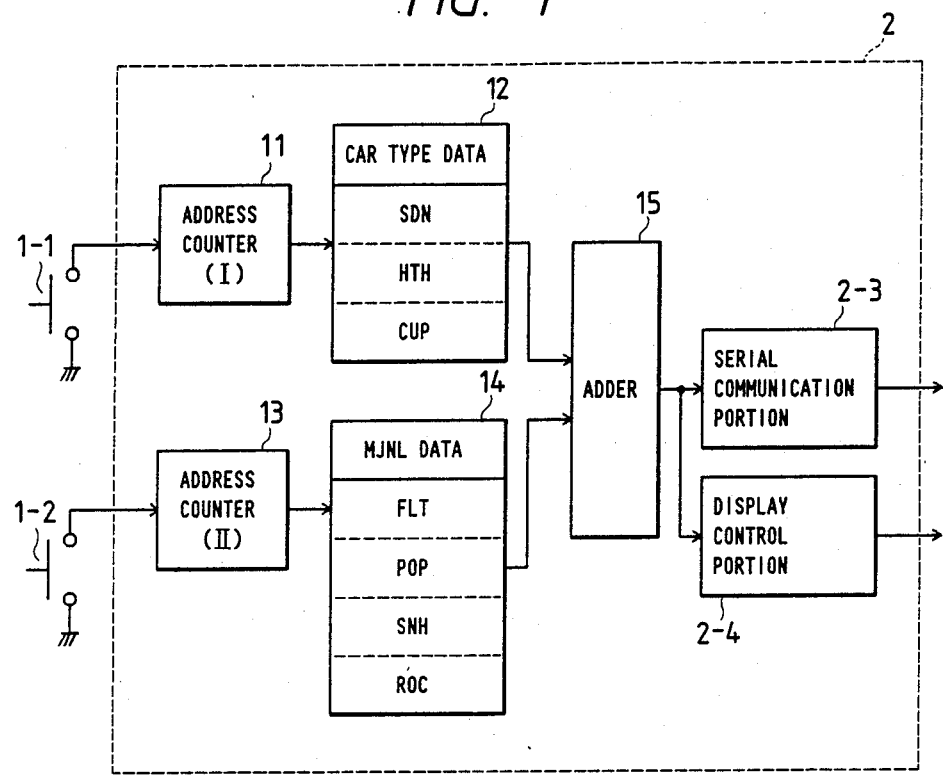
FIG. 1 is a functional block of an embodiment of the present invention.

A functional block of the microcomputer 2 of the present embodiment is shown in FIG. 1. In FIG. 1, a first address counter 11 receives an output of the CAR key 1-1 and a second address counter 13 receives an output of the MJNL key 1-2. A car type data memory device 12, a music genre data (referred to as MJNL data) memory device 14, an adder 15 for adding the car type data and the MJNL data are shown as well as the serial communication portion and the control display portion.

In the car type data memory device 12, data (a first group of frequency characteristics) related to compensation for sound characteristics of spatial configurations of different car rooms are stored. An example of the data for the frequency characteristics is shown in Table 1.

TABLE 1

| car type | frequency (Hz) | | | | |
|---|---|---|---|---|---|
| | 60 | 250 | 1K | 3.3K | 10K |
| SDN | +10 | 0 | 0 | 0 | +10 |
| HTH | +8 | −2 | +4 | 0 | +4 |
| CUP | +6 | −4 | 0 | 0 | +10 |

In Table 1, SDN, HTH and CUP represent sedan type car, hatchback type car and coupe type car, respectively.

On the other hand, in the MJNL data memory device 14, correction data (second group of frequency characteristics) related to optimum frequency characteristics for musical genre are stored. An example of such correction data is shown in Table 2.

TABLE 2

| genre | frequency (Hz) | | | | |
|---|---|---|---|---|---|
| | 60 | 250 | 1K | 3.3K | 10K |
| FLT | 0 | 0 | 0 | 0 | 0 |
| POP | 0 | +4 | +8 | +4 | 0 |
| SNH | +4 | 0 | −2 | +2 | +4 |
| ROC | +8 | +4 | 0 | −2 | 0 |

In Table 2, FLT represents a flatness in which gains in respective frequency ranges become flat, POP represents pop music, SNH represents synthesized music and ROC represents rock music.

An operation of this embodiment will be described briefly.

Figure 3:
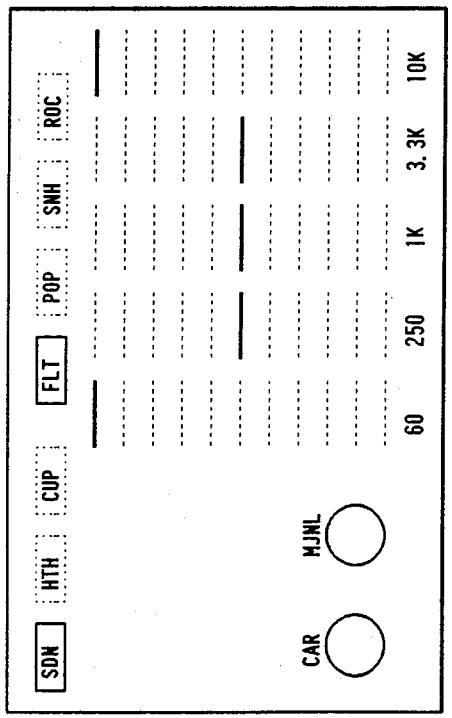

FIG. 3 shows an example of the operation display portion 4 of this embodiment, which is shown in FIG. 1 and 2. Indicators such as lamps or LED's labeled SDN, HTH and CUP on the operation display portion 4 are related to the respective frequency characteristics of the first group, an activation of any one of them showing a selected frequency characteristics for correcting sound characteristics of a specific spatial configulation of car room of a sedan type car, hatchback type car or coupe type car, respectively.

Further, indicators labeled FLT, POP, SNH and ROC are related to the respective frequency characteristics of the second group, an activation thereof showing a selected frequency characteristics providing a flat gain in the frequency range or frequency characteristics optimum for pop music, synthesized music or rock music.

When the CAR key 1-1 is actuated once while assuming that the indicators SDN and FLT have been lit as shown by solid lines in FIG. 3, a car type frequency characteristics HTH (hatchback) is selected from the first group of frequency characteristics stored in the RAM 2-2, i.e., the car type data memory device 12 of the micro computer 2. This characteristics HTH has values shown in Table 1. These values and the characteristics of FLT of the second group of frequency characteristics which has been set preliminally are added in the adder 15, a result being sent to the serial communication portion 2-3. The serial communication portion 2-3 converts this sum into a suitable data form and transfers it to the equalizer 3. Upon this, a frequency characteristics of a reproducd sound is changed to a desired frequency characteristics for the hatchback type car room.

Figure 4:
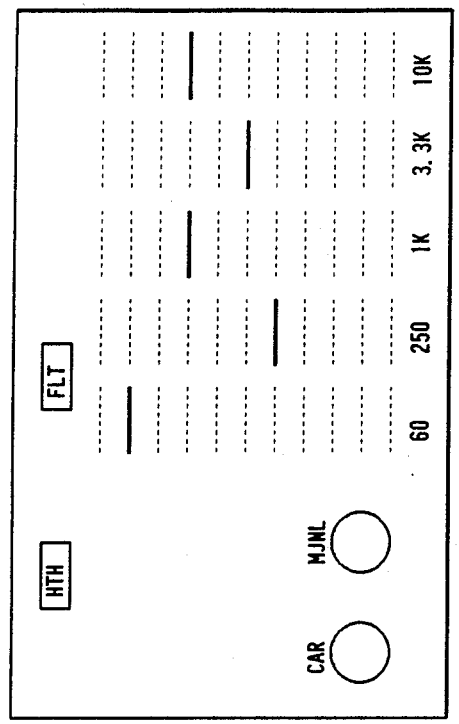
FIGS. 3 and 4 show examples of display on an operation display portion thereof.

In this case, a display on the operation display portion 4 becomes as shown in FIG. 4. In the display on the operation display portion in FIG. 4, the 6th line indicates a 0 level and each level shift from the 0 level line indicates a level change of 2. That is, the 5th level is +2 level and the 7th level is −2 level. For the levels higher than +10 and lower than −10, they are displayed as the top level and the bottom level, respectively.

Figure 5:
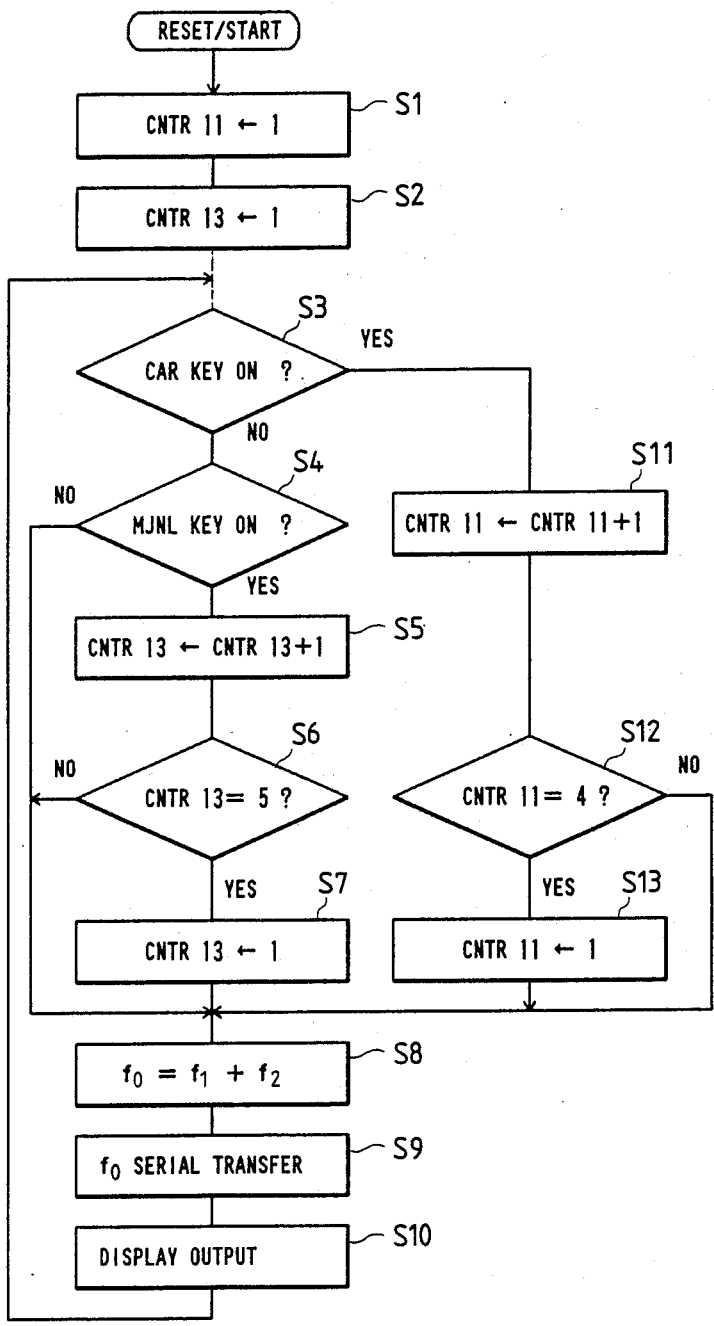
FIG. 5 is a flowchart for explanation of an operation of a microcomputer of this embodiment.

Since the above mentioned operation control is realized by the microcomputer 2, an operation of the microcomputer will be described with reference to the flowchart shown in FIG. 5. It should be noted that FIG. 5 shows only portions which are necessary to explain the operation of this embodiment, the remaining portions being omitted.

First, when the microcomputer 2 is powered to reset/start of a program, the first and the second adderss counters 11 and 13 (see FIG. 1) are set with initial values 1 in the steps S1 and S2, respectively.

Then it is checked in the step S3 whether the CAR key 1-1 is depressed. If no, then it is checked in the step S4 whether the MJNL key 1-2 is depressed. If no, the operation is shifted to the step S8. In the step S8, the frequency caracteristics data of the SDN and the FLT are readout from the RAM when the address counter 11=1 and the address counter 13=1, respectively, which are added to obtain in a composite frequency characteristics f0.

When the value of the first address counter 11 is 1, 2 or 3, the data of the SDN, HTH or CUP of the car type data memory 12 is accessed, respectively, while, when the value of the second address counter 13 is 1, 2, 3 or 4, the data of FLT, POP, SNH or ROC of the MJNL data memory 14 is accessed, respectively. The composite frequency characteristics f0 (=f1+f2) is converted into a suitable form to be received by the equalizer 3.

Then, in the step S9, the data of the composite frequency characteristics f0 is transmitted to the equalizer 3 to make the audio apparatus ready to reproduce the composite frequency characteristics of the SDN and FLT.

Further, a display operation on the operation display portion 4 is performed in the step S10 to obtain a display shown in FIG. 3.

On the other hand, when the decision in the step S3 is yes, that is, the CAR key 1-1 is depressed, the value of the address counter 11 is incremented by 1 in the step S11, resulting in a value 2 set in the counter 11.

Then, in the step S12, it is checked whether the content of the address counter 11 is 4. Since it is no because the current value of the address counter 11 is 2, the counter value 2 is kept unchanged. If the decision in the step S12 is yes, the operation is moved to the step S13 to reset the address counter 11 to 1.

Then, in the step S8, the composite frequency characteristics f0 of HTH and FLT is obtained in the similar way to that mentioned previously and, in the step S9, the frequency characteristics f0 is transferred to the equalizer 3. Further, in the step S10, a display output is sent to the operation display portion 4, so that the display shown in FIG. 3 is changed to that shown in FIG. 4.

On the other hand, when the decision in the step S4 is yes, that is, the MJNL key 1-2 is depressed, the second address counter 13 is incremented by 1 through the steps S5, S6 and S7, similarly, to change the frequency characteristics from the current state of FLT to a preceding POP. Then, in the step S8, the composite frequency characteristics of HTH and POP is obtained. Thereafter, in the step S9, the frequency characteristics to the equalizer 3 is set and, in the step S10, a display output is sent to the operation display portion.

As mentioned above, upon the operations of the CAR key 1-1 and the MJNL key 1-2 by the user, a frequency characteristics suitable for both the type of car and music is easily obtained, so that the user can always listen sound in optimum conditions.

Figure 6:
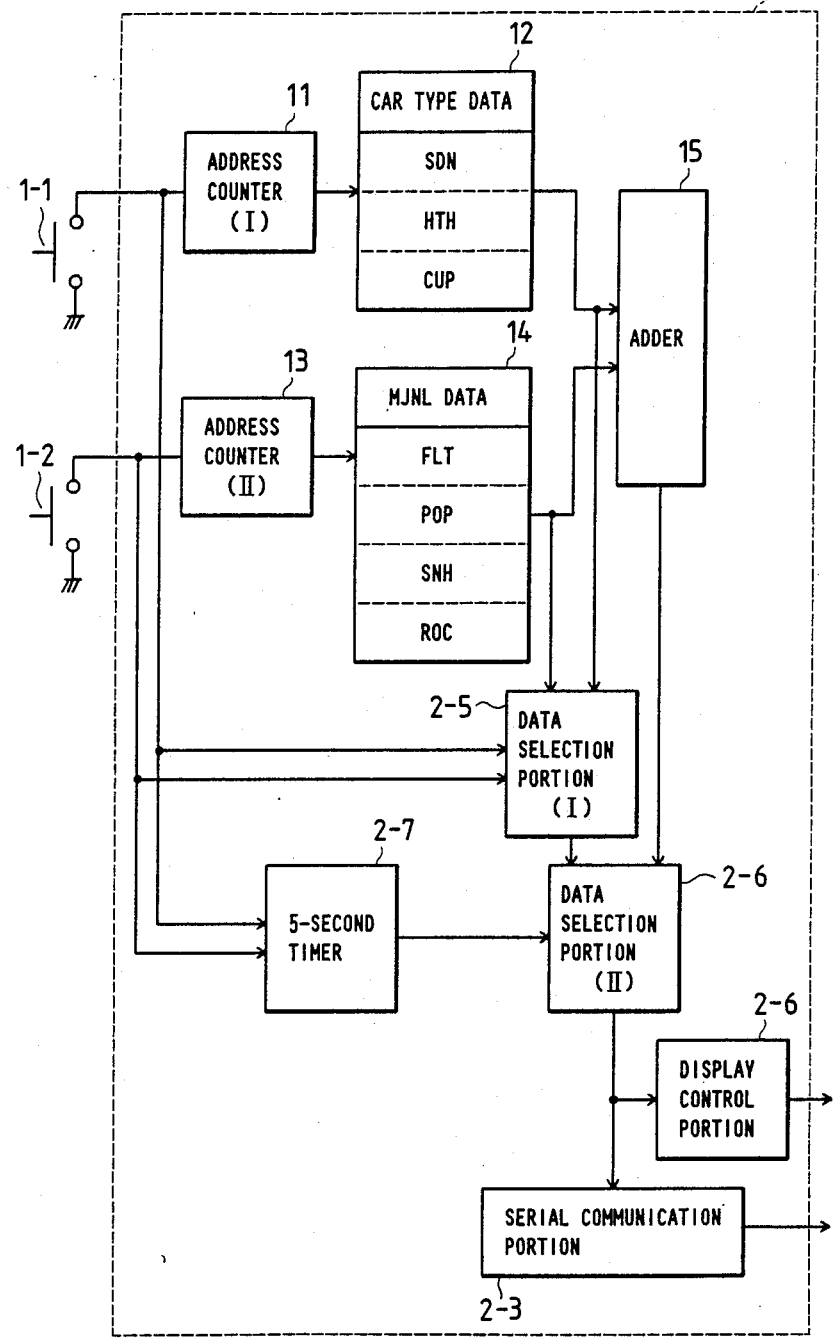
FIG. 6 is a functional block diagram of a second embodiment of the present invention.

FIG. 6 shows a functional block of the microcomputer 2 shown in FIG. 1 according to a second embodiment of the present invention.

In FIG. 6, a first data selection portion 2-5, a second data selection portion 2-6 and a 5 second timer 2-7 are added to the first embodiment shown in FIG. 1.

A difference of this embodiment from the first embodiment is that, when either the CAR key 1-1 or the MJNL key 1-2 is depressed to perform the change of frequency characteristics, sound having frequency characteristics assigned by the CAR key or the MJNL key can be listened for a certain time period, say, 5 seconds, and subsequently a sound having a composite frequency characteristics obtained as mentioned previously is available. Thus, it is possible to recognize a difference in the reproduced sound therebetween.

Figure 7:
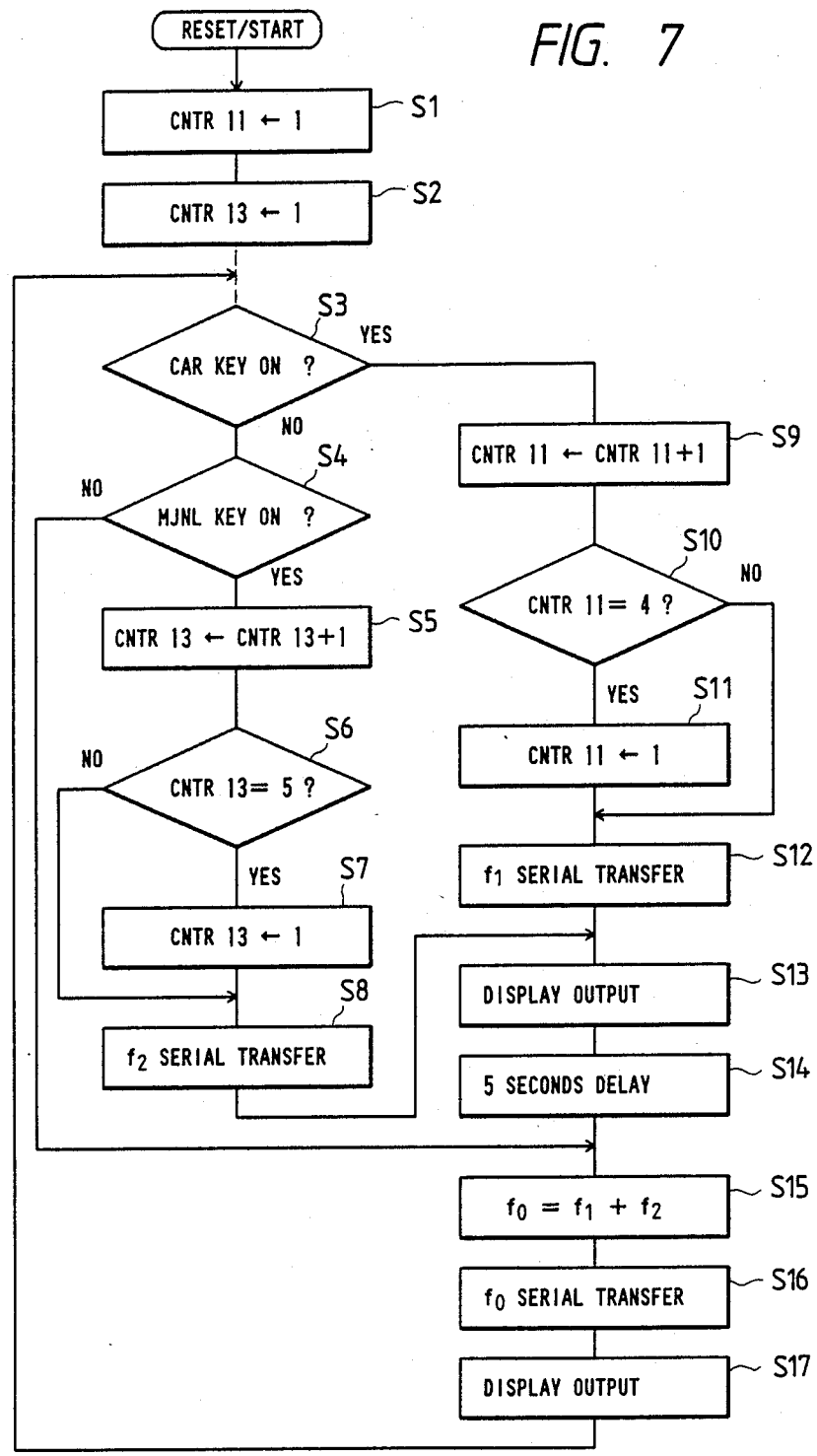
FIG. 7 is a flowchart for explanation of an operation of a microcomputer of the second embodiment.

An operation of this embodiment will be described in detail with reference to FIG. 7.

Initially, as in the same manner mentioned with respect to the first embodiment, when the microcomputer 2 is powered, the rest/start is initialized. That is, an initial value 1 is set in the first and second address counters 11 and 13, respectively in the steps S1 and S2. Then, it is decided in the step S3 and S4 whether the CAR key 1-1 or the MJNL key 1-2 is depressed. If neither of them is depressed, the operation is shifted to the step S15 in which the frequency characteristics data of the SDN and FLT are readout when the address counter 11=1 and the address counter 13=1 and a composite frequency characteristics f0 is obtained in the serial communication portion 2-3. The composite frequency characteristics f0 is serially sent to the equalizer 3 in the next step S16. Simultaneously, it is displayed on the display portion 4. The display at this time is the same as that shown in FIG. 3.

Since the above operation is for the case where neither the CAR key 1-1 nor the MJNL key 1-2 is depressed, the 5 second timer 2-7 is inactive and the second data selection portion 2-6 selects the data of the adder portion 15 and sends them to the serial communication portion 2-3 and to the display control portion 2-4.

Then, when the MJNL key 1-2 is depressed, the operation is shifted from the step S4 to the step S5 in which the address counter 13 is incremented by 1, resulting in the content of the address counter 13 being 2. Then, since the decision in the step S6 is no because the current value of the counter 13 is 2, the value of the address counter 13 remains 2.

Figure 8:
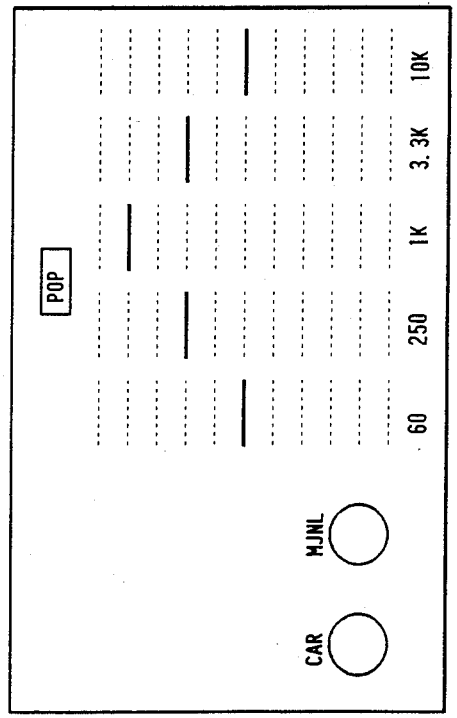

The value 2 of the address counter 13 is transferred, in the step S8, to the equalizer 3 in which the frequency characteristics for POP corresponding to this value is set. Further, in the step S13, the POP frequency characteristics is displayed on the operation display portion 4. The setting and display of this POP frequency characteristics are performed in the step S14 for a certain time, in this embodiment, for 5 seconds. The display in this case becomes as shown in FIG. 8.

Returning to FIG. 6, when the MJNL key 1-2 is depressed as mentioned, the first data selection portion 2-5 operates to select the data in the MJNL data memory device 14. The 5 second timer 2-7 is actuated and the second data selection portion 2-6 selects an output of the first data selection portion for 5 seconds. Therefore, the POP frequency characteristics is sent to the serial communication portion 2-3 and the display control portion 2-4 as mentioned previously.

Figure 9:
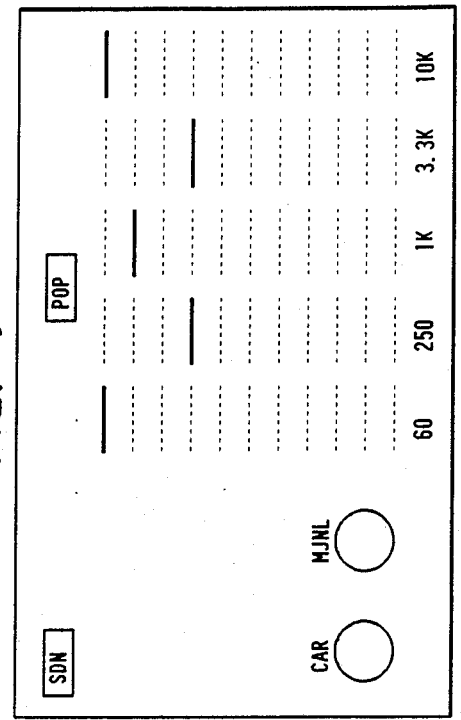
FIGS. 8 and 9 show examples of display on an operation display portion.

After 5 seconds lapses in the step S14, the operation is shifted to the step S15 to obtain a composite frequency characteristics f0 of the unchanged car type frequency characteristics data f1 and the changed MJNL type frequency characteristics data f2 obtained in the step S16. Then, the composite frequency characteristics f0 is serially transferred to and set in the equalizer 3 in the step S16 and displayed on the operation display portion 4 in the step S17, similarly. The display in this case bacomes as shown in FIG. 9.

On the other hand, when the CAR key 1-1 is depressed to turn it on, the operation is shifted to the step S9 in which the first address counter 11 is incremented by 1. Then, as mentioned previously, the frequency characteristics data f1 corresponding to a car of the type assigned by the address counter 11 is serially transferred to the equalizer 3 in the step S12 and displayed in the step S13. This state is maintained for 5 seconds in the step S14 and thereafter the operation is shifted to the step S15 in which the operations for obtaining the composite frequency characteristics f0, for transferring this to the equalizer 3 in the step S16 and displaying this on the operation display portion 4 in the step S17 are performed, as in the previous case.

As mentioned previously, when the CAR key 1-1 is depressed, the first data selection portion 2-5 in FIG. 6 selects the output of the car type data memory device 12 and the second data selection portion 2-6 selects the output data of the first data selection portion 2-5 for 5 seconds given by the 5 second timer 2-7 and sends it to the serial communication portion 2-3 and the display control portion 2-4. It is clear that the second data selection portion 2-6 selects the output of the adder portion 15 and sends it to the serial communication portion 2-3 and the display control portion 2-4 after the 5 second timer becomes inoperative.

As mentioned hereinbefore, according to the this embodiment, it is possible to obtain, in addition to the effect provided by the first embodiment, an effect that a listener can hear, for a certain time, sound characteristics selected by either the CAR key or the MJNL key and thereafter a conposite sound characteristics. Therefore, it is possible to recognize the change of sound between.

According to the present invention, since it is possible to easily correct sound characteristics as that sound having frequency characteristics optimum for any combination of spatial configulation of car room and sound source is obtained, it is possible to always listen music, etc., under the optimum condition with a simplest manual operation regardless of the type of car.

Further, since it is also possible to listen a sound prior to and after a correction for car room configulation and a sound source, a change therebetween can be recognized.

What is claimed is:

1. An audio apparatus having an electronic graphic equalizer capable of arbitrarily controlling gains in respective frequency ranges within an audible frequency range, first memory means for storing frequency characteristics curves for respective types of car room configuration, second memory means for storing frequency characteristics curves for respective sound sources, first selection means for selecting one of frequency characteristics curves stored in said first memory means, a second selection means for selecting one of frequency characteristics curves stored in said second memory means, and means for adding the two frequency characteristics read out from said first and said second memory means to obtain a composite frequency characteristic, whereby a frequency characteristic suitable for a specific sound source to be reproduced in a specific car room is obtained.

2. The audio apparatus as claimed in claim 1, wherein each of said first selection means and said second selection means includes a push button switch and an address counter to be incremented by an operation of the respective push button switch.

3. The audio apparatus as claimed in claim 2, further comprising a serial communication portion for transmitting said composite frequency characteristic to said equalizer.

4. The audio apparatus as claimed in claim 3, further comprising a display portion for displaying said composite frequency characteristic.

5. The audio apparatus as claimed in claim 3, further comprising third selection means responsive to an output of either of said first or said second selection means for selectively outputtting either of said frequency characteristics selected by said first and said second selection means, delay means for delaying said output of said either first or second selection means for a predetermined time and fourth selection means responsive to an output of said delay means for allowing said composite frequency characteristic to pass to said equalizer.

6. The audio apparatus as claimed in claims 3, wherein at least said first and second selection means, said first and second memory means, said means for adding, said serial communication portion, and a control means for said display portion are constituted with a microcomputer.

* * * * *